United States Patent
Fuyuki et al.

(10) Patent No.: US 11,081,605 B2
(45) Date of Patent: Aug. 3, 2021

(54) SEMICONDUCTOR LAMINATE, LIGHT-RECEIVING ELEMENT, AND METHOD FOR MANUFACTURING SEMICONDUCTOR LAMINATE

(71) Applicant: SUMITOMO ELECTRIC INDUSTRIES, LTD., Osaka (JP)

(72) Inventors: Takuma Fuyuki, Osaka (JP); Tomohiro Doi, Osaka (JP); Takashi Go, Osaka (JP); Takashi Ishizuka, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/635,482

(22) PCT Filed: Aug. 24, 2018

(86) PCT No.: PCT/JP2018/031313
§ 371 (c)(1),
(2) Date: Jan. 30, 2020

(87) PCT Pub. No.: WO2019/044686
PCT Pub. Date: Mar. 7, 2019

(65) Prior Publication Data
US 2020/0203542 A1 Jun. 25, 2020

(30) Foreign Application Priority Data
Sep. 1, 2017 (JP) .............................. JP2017-168971

(51) Int. Cl.
*H01L 31/0352* (2006.01)
*H01L 31/18* (2006.01)
(Continued)

(52) U.S. Cl.
CPC .. *H01L 31/035236* (2013.01); *H01L 31/0304* (2013.01); *H01L 31/03042* (2013.01);
(Continued)

(58) Field of Classification Search
CPC ........... H01L 31/035236; H01L 31/109; H01L 31/1844; H01L 31/0304; H01L 31/03042; H01L 31/03046
(Continued)

(56) References Cited

U.S. PATENT DOCUMENTS 5,471,494 A 11/1995 Mataki et al.
2003/0013224 A1* 1/2003 Shimizu ................. B82Y 20/00
438/47
(Continued)

FOREIGN PATENT DOCUMENTS

JP 05-291688 A 11/1993
JP 2010-258097 A 11/2010
(Continued)

OTHER PUBLICATIONS

Sidhu, R., et al., "A Long-Wavelength Photodiode on InP Using Lattice-Matched GaInAs—GaAsSb Type-II Quantum Wells," IEEE Photonics Technology Letters, vol. 17, No. 12, Dec. 2005, pp. 2715-2717.
Peter, M., "Light-emitting diodes and laser diodes based on a Ga1_xInxAs/GaAs1-ySby type II superlattice on InP substrate," Applied Physics Letters, 1999, vol. 74, pp. 1951-1953.

*Primary Examiner* — David Vu
*Assistant Examiner* — Brandon C Fox
(74) *Attorney, Agent, or Firm* — Volpe Koenig

(57) ABSTRACT

A semiconductor laminate includes a substrate formed of a group III-V compound semiconductor and a quantum well structure disposed on the substrate. The quantum well structure includes a second element layer formed of a group III-V compound semiconductor and containing Sb and a first element layer formed of a group III-V compound semicon-
(Continued)

ductor and disposed in contact with the second element layer. In the first element layer, the thickness of a region in which the content of Sb decreases in a direction away from the substrate from 80% of the maximum content of Sb in the second element layer to 6% of the maximum content is from 0.5 nm to 3.0 nm inclusive.

12 Claims, 8 Drawing Sheets

(51) Int. Cl.
      *H01L 31/109*     (2006.01)
      *H01L 31/0304*   (2006.01)

(52) U.S. Cl.
      CPC ...... *H01L 31/03046* (2013.01); *H01L 31/109* (2013.01); *H01L 31/1844* (2013.01)

(58) Field of Classification Search
      USPC .......................................................... 257/21
      See application file for complete search history.

(56) References Cited

U.S. PATENT DOCUMENTS

| | | | |
|---|---|---|---|
| 2010/0270583 | A1 | 10/2010 | Takano et al. |
| 2012/0168720 | A1* | 7/2012 | Akita ................ H01L 31/03046 257/21 |
| 2013/0048838 | A1* | 2/2013 | Mori ............... H01L 31/035236 250/214.1 |
| 2013/0313521 | A1 | 11/2013 | Akita et al. |
| 2014/0319463 | A1 | 10/2014 | Fujii et al. |
| 2014/0374701 | A1 | 12/2014 | Wei |
| 2016/0247951 | A1 | 8/2016 | Fujii et al. |
| 2016/0351739 | A1* | 12/2016 | Clara ............... H01L 31/035209 |

FOREIGN PATENT DOCUMENTS

| | | |
|---|---|---|
| JP | 2013-187309 A | 9/2013 |
| JP | 2014-216624 A | 11/2014 |
| WO | 2012/114849 A1 | 8/2012 |
| WO | 2015/059988 A1 | 4/2015 |

\* cited by examiner

SEMICONDUCTOR LAMINATE, LIGHT-RECEIVING ELEMENT, AND METHOD FOR MANUFACTURING SEMICONDUCTOR LAMINATE

TECHNICAL FIELD

The present disclosure relates to a semiconductor laminate, to a light-receiving device, and to a method for manufacturing the semiconductor laminate. The present application claims priority from Japanese Patent Application No. 2017-168971 filed on Sep. 1, 2017, the entire contents of which are incorporated herein by reference.

A semiconductor laminate having a structure including a substrate made of a group III-V compound semiconductor and semiconductor layers made of group III-V compound semiconductors and formed on the substrate can be used to manufacture a light-receiving device having sensitivity to light in the infrared region. Specifically, a light-receiving device for infrared light can be obtained, for example, by forming a quantum well structure formed of group III-V compound semiconductors etc. on a substrate formed of a group III-V compound semiconductor and further forming appropriate electrodes. One previously reported light-receiving device is a photodiode with a cutoff wavelength of 2 μm to 5 μm (see, for example, NPL 1).

CITATION LIST

Non Patent Literature

NPL 1: R. Sidhu, et al., "A Long-Wavelength Photodiode on InP Using Lattice-Matched GaInAs—GaAsSb Type-II Quantum Wells," IEEE PHOTONICS TECHNOLOGY LETTERS, VOL. 17, NO. 12, Dec. 2005, p. 2715-2717

SUMMARY OF INVENTION

The semiconductor laminate of the present disclosure includes a substrate formed of a group III-V compound semiconductor and a quantum well structure disposed on the substrate. The quantum well structure includes a second element layer formed of a group III-V compound semiconductor and containing Sb and a first element layer disposed in contact with the second element layer and containing a group III-V compound semiconductor. In the first element layer, the thickness of a region in which the content of Sb decreases in a direction away from the substrate from 80% of a maximum content of Sb in the second element layer to 6% of the maximum content is from 0.5 nm to 3.0 nm inclusive.

DESCRIPTION OF EMBODIMENTS

Description of Embodiments of Present Disclosure

Figure 1:
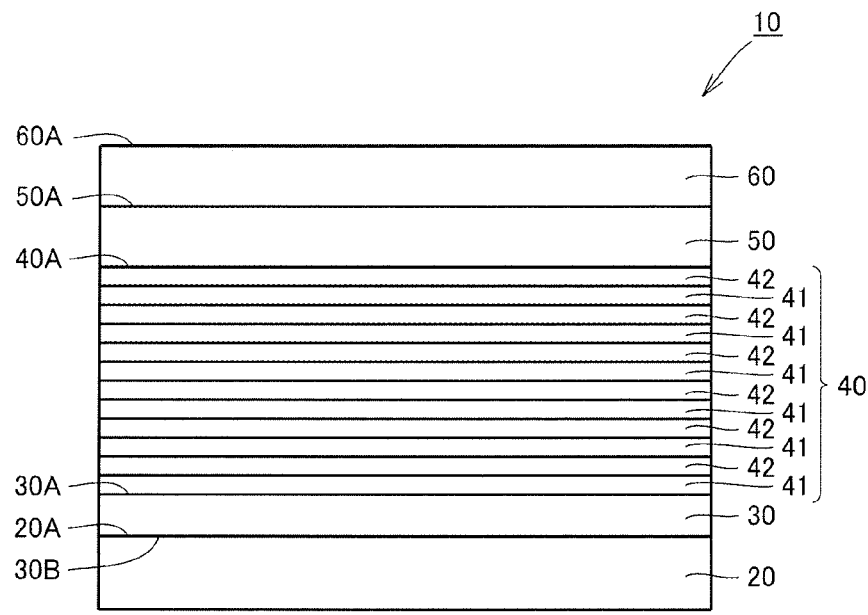
FIG. 1 is a schematic cross-sectional view showing the structure of a semiconductor laminate in embodiment 1.

There is a need for a light-receiving device with increased sensitivity. The sensitivity of a light-receiving device can be increased by reducing the concentration of carriers in a quantum well structure.

The semiconductor laminate of the present disclosure includes a substrate formed of a group III-V compound semiconductor and a quantum well structure disposed on the substrate. The quantum well structure includes a second element layer formed of a group III-V compound semiconductor and containing Sb and a first element layer formed of a group III-V compound semiconductor and disposed in contact with the second element layer. In the first element layer, the thickness of a region in which the content of Sb decreases in a direction away from the substrate from 80% of the maximum content of Sb in the second element layer to 6% of the maximum content is from 0.5 nm to 3.0 nm inclusive.

The present inventors have conducted studies to reduce the concentration of carriers in the quantum well structure. The inventors have found that the carrier concentration in the quantum well structure can be reduced by appropriately setting Sb steepness in the first element layer of the quantum well structure. In the present disclosure, the "Sb steepness" in the first element layer means the thickness of a region in which the content of Sb decreases in the direction away from the substrate from 80% of the maximum content of Sb (the maximum content of Sb in the second element layer) to 6% of the maximum content.

Generally, in a quantum well structure including a first element layer and a second element layer containing Sb and disposed in contact with the first element layer, the Sb steepness is set to zero in the design stage. Practically, it is difficult to change the content of Sb discontinuously. Although the Sb steepness cannot be reduced to 0, it is preferable that the Sb steepness is as small as possible. The studies by the inventors have shown that the carrier concentration in the quantum well structure can be reduced by intentionally changing the content of Sb in the first element layer gently, i.e., by intentionally increasing the Sb steepness. This may be because an appropriate amount of Sb atoms mixed provides a surfactant effect.

Specifically, by setting the Sb steepness in the first element layer to 0.5 nm or more, the carrier concentration in the quantum well structure can be reduced. If the Sb steepness in the first element layer exceeds 3.0 nm, the carrier concentration in the quantum well structure increases steeply. Specifically, by setting the Sb steepness in the first element layer to from 0.5 nm to 3.0 nm inclusive, the carrier concentration in the quantum well structure can be reduced.

In the semiconductor laminate of the present disclosure, the Sb steepness in the first element layer is from 0.5 nm to 3.0 nm inclusive. Therefore, in the semiconductor laminate provided in the present application, the carrier concentration in the quantum well structure is reduced, and the sensitivity can thereby be increased. To further reduce the carrier concentration in the quantum well structure, the Sb steepness is preferably 1.0 nm or more and more preferably 1.5 nm or more. To further reduce the carrier concentration in the quantum well structure, the Sb steepness is preferably 2.8 nm or less.

In the semiconductor laminate, the quantum well structure may be a type-II quantum well structure. In this case, the semiconductor laminate can be easily designed to be suitable for a light-receiving device having sensitivity to light in the infrared region.

In the semiconductor laminate, the first element layer may be an $In_xGa_{1-x}As$ (x is from 0.38 to 1 inclusive) layer or a $Ga_{1-u}In_uN_vAs_{1-v}$ (u is from 0.4 to 0.8 inclusive, and v is more than 0 and 0.2 or less) layer. The second element layer may be a $GaAs_{1-y}Sb_y$ (y is from 0.36 to 1 inclusive) layer. In this case, the semiconductor laminate can be easily designed to be suitable for a light-receiving device having sensitivity to light in the near-infrared region to the mid-infrared region.

In the semiconductor laminate, the substrate may be formed of GaAs (gallium arsenide), GaP (gallium phosphide), GaSb (gallium antimonide), InP (indium phosphide), InAs (indium arsenide), InSb (indium antimonide), AlSb (aluminum antimonide), or AlAs (aluminum arsenide). In this case, the quantum well structure formed can be easily designed to be suitable for detection of light in the near-infrared region to the mid-infrared region.

The light-receiving device of the present disclosure includes the semiconductor laminate and electrodes formed on the semiconductor laminate. Therefore, the carrier concentration in the quantum well structure functioning as a light-receiving layer can be reduced. The sensitivity of the light-receiving device can thereby be increased.

The semiconductor laminate manufacturing method of the present disclosure includes the steps of: preparing a substrate formed of a group III-V compound semiconductor; and forming epilayers formed of respective group III-V compound semiconductors on the substrate. The step of forming the epilayers includes the step of forming a quantum well structure. In the step of forming the quantum well structure, a second element layer formed of a group III-V compound semiconductor and containing Sb and a first element layer disposed in contact with the second element layer and formed of a group III-V compound semiconductor are formed. In the step of forming the quantum well structure, the first element layer and the second element layer are formed such that, in the first element layer, the thickness of a region in which the content of Sb decreases in a direction away from the substrate from 80% of a maximum content of Sb in the second element layer to 6% of the maximum content is from 0.5 nm to 3.0 nm inclusive.

In the step of forming the quantum well structure in the semiconductor laminate manufacturing method of the present disclosure, the first element layer and the second element layer containing Sb are formed such that Sb steepness in the first element layer is from 0.5 nm to 3.0 nm inclusive. Therefore, with the semiconductor laminate manufacturing method of the present disclosure, a semiconductor laminate in which its sensitivity can be increased by reducing the carrier concentration in the quantum well structure can be manufactured.

In the step of forming the quantum well structure in the semiconductor laminate manufacturing method, the first element layer and the second element layer containing Sb may be formed such that the Sb steepness in the first element layer is from 1.0 nm to 3.0 nm inclusive. In the step of forming the quantum well structure, the first element layer and the second element layer may be formed in the temperature range of from 510° C. to 570° C. inclusive. In this manner, the Sb steepness can be easily adjusted to an appropriate value.

In the step of forming the quantum well structure in the semiconductor laminate manufacturing method, the first element layer and the second element layer may be formed under the condition that the ratio of the supply amount of a raw material of a group V element to the supply amount of a raw material of a group III element is 1 or less. In this manner, the Sb steepness can be easily adjusted to an appropriate value.

In the step of forming the quantum well structure in the semiconductor laminate manufacturing method, the first element layer and the second element layer may be formed at a growth rate of 0.1 μm/h or less. In this manner, the Sb steepness can be easily adjusted to an appropriate value.

Details of Embodiments of Present Disclosure

Embodiment 1

Next, embodiment 1 will be described with reference to the drawings. In the following drawings, the same or corresponding components are denoted by the same reference numerals, and the description thereof may not be repeated.

Referring to FIG. 1, a semiconductor laminate 10 in the embodiment includes a substrate 20, a buffer layer 30, a quantum well structure 40, a blocking layer 50, and a contact layer 60.

The substrate 20 is formed of a group III-V compound semiconductor. The substrate 20 has a diameter of 50 mm or more and, for example, 3 inches. The group III-V compound semiconductor forming the substrate 20 may be, for example, GaAs, GaP, GaSb, InP, InAs, InSb, AlSb, or AlAs. By using the substrate 20 formed of any of these group III-V compound semiconductors, a semiconductor laminate 10 suitable for manufacturing a light-receiving device for infrared light can be easily obtained. Specifically, for example, InP (n-InP) having n-type conductivity is used as the compound semiconductor forming the substrate 20. For example, S (sulfur) may be used as n-type impurities contained in the substrate 20. The diameter of the substrate 20 may be 80 mm or more (e.g., 4 inches), 105 mm or more (e.g., 5 inches), and 130 mm or more (e.g., 6 inches) for the purpose of improving the production efficiency and yield of semiconductor devices (light-receiving devices) using the semiconductor laminate 10.

The buffer layer 30 is a semiconductor layer disposed in contact with a first principal surface 20A of the substrate 20. The buffer layer 30 is formed of a group III-V compound semiconductor. For example, a binary material such as GaSb, AlSb (aluminum antimonide) or InSb (indium antimonide) or a ternary material such as GaInSb (gallium indium antimonide), AlInSb (aluminum indium antimonide), or AlGaSb (aluminum gallium antimonide) may be used as the group III-V compound semiconductor forming the buffer layer 30. Specifically, for example, InGaAs (indium gallium arsenide) (n-InGaAs) having n-type conductivity is used as the compound semiconductor forming the buffer layer 30. For example, Si (silicon) may be used as n-type impurities contained in the buffer layer 30. The buffer layer 30 is not an essential component. Specifically, the quantum well structure 40 may be disposed on the first principal surface 20A of the substrate 20.

The quantum well structure 40 is disposed in contact with a first principal surface 30A of the buffer layer 30 that is opposite to its surface facing the substrate 20. The quantum well structure 40 has a structure in which two types of element layers formed of group III-V compound semiconductors are laminated alternately. More specifically, the quantum well structure 40 has a structure in which first element layers 41 and second element layers 42 are laminated alternately. For example, $In_xGa_{1-x}As$ (x is from 0.38 to 1 inclusive) may be used as the material forming the first element layers 41. The first element layers 41 are layers in which Sb is not intentionally added (layers in which the source gas for Sb is not intentionally added to source gases during growth). For example, $GaAs_{1-y}Sb_y$ (y is from 0.36 to 1 inclusive) (gallium arsenide antimonide) containing Sb as a group V element may be used as the material forming the second element layers 42. The materials forming the first element layers 41 and the second element layers 42 are not limited to the above materials. For example, $Ga_{1-u}In_uN_vAs_{1-v}$ (u is from 0.4 to 0.8 inclusive, and v is more than 0 and 0.2 or less) (gallium indium nitride arsenide) may be used as the material forming the first element layers 41, and, for example, $GaAs_{1-y}Sb_y$ (y is from 0.36 to 0.62 inclusive) containing Sb as a group V element may be used as the material forming the second element layers 42.

As described above, by using the multiple quantum well structure including pairs of an $In_xGa_{1-x}As$ (x is from 0.38 to 1 inclusive) layer and a $GaAs_{1-y}Sb_y$ (y is from 0.36 to 1 inclusive) layer or pairs of a $Ga_{1-u}In_uN_vAs_{1-v}$ (u is from 0.4 to 0.8 inclusive, and v is more than 0 and 0.2 or less) and a $GaAs_{1-y}Sb_y$ (y is from 0.36 to 0.62 inclusive) layer as a quantum well light-receiving layer, a semiconductor laminate 10 usable for manufacturing a light-receiving device suitable for detection of light in the near-infrared region to the mid-infrared region can be obtained.

InAs may be used as the material forming the first element layers 41, and GaSb may be used as the material forming the second element layers 42. By using the multiple quantum well structure including pairs of an InAs layer and a GaSb layer as the quantum well light-receiving layer, a semiconductor laminate 10 usable for manufacturing a light-receiving device suitable for detection of infrared light having a wavelength of 4 to 12 µm can be obtained.

To compensate for strain in the quantum well structure 40, unit structures forming the quantum well structure 40 may each include a strain compensation layer in addition to the first element layer 41 and the second element layer 42.

Referring to FIG. 1, the blocking layer 50 is disposed in contact with a principal surface 40A of the quantum well structure 40 that is opposite to its surface facing the buffer layer 30. The blocking layer 50 is formed of a group III-V compound semiconductor.

For example, InGaAs (indium gallium arsenide) may be used as the group III-V compound semiconductor forming the blocking layer 50. Specifically, for example, undoped InGaAs (ud-InGaAs) is used as the compound semiconductor forming the blocking layer 50. The blocking layer 50 disposed can prevent diffusion of impurities contained in the contact layer 60 into the quantum well structure.

Referring to FIG. 1, the contact layer 60 is disposed in contact with a principal surface 50A of the blocking layer 50 that is opposite to its surface facing the quantum well structure 40. The contact layer 60 is formed of a group III-V compound semiconductor.

For example, InP, InAs, GaSb, GaAs, InGaAs (indium gallium arsenide), etc. may be used as the group III-V compound semiconductor forming the contact layer 60. Specifically, for example, InP (p-InP) having p-type conductivity may be used as the compound semiconductor forming the contact layer 60. p-Type impurities contained in the contact layer 60 may be, for example, Zn.

The thickness of the quantum well structure 40 is 0.5 µm (500 nm) or more. Specifically, the thickness of each of the first element layers 41 and the thickness of each of the second element layers 42 are, for example, 5 nm.

The quantum well structure 40 may include 250 unit structures laminated one on another and each consisting of a first element layer 41 and a second element layer 42. Specifically, the thickness of the quantum well structure 40 may be, for example, 2.5 µm. The quantum well structure 40 may be a type-II quantum well structure having such a structure.

The Sb steepness in each of the first element layers 41 is from 0.5 nm to 3.0 nm inclusive.

Specifically, the ratio of the Sb steepness to the thickness of each first element layer 41 is from 10% to 60% inclusive. Therefore, in the semiconductor laminate 10 in the present embodiment, the sensitivity can be increased by reducing the carrier concentration in the quantum well structure 40. The ratio of the Sb steepness to the thickness of each first element layer 41 is preferably 20% or more and more preferably 30% or more. The ratio of the Sb steepness to the thickness of each first element layer 41 is preferably 56% or less.

Preferably, in the semiconductor laminate 10, the buffer layer 30, the quantum well structure 40, the blocking layer 50, and the contact layer 60 are laminated on the substrate 20 without formation of a regrown interface. The sensitivity can thereby be further improved.

In the semiconductor laminate 10, the concentrations of oxygen, carbon, and hydrogen at the interface between the buffer layer 30 and the quantum well structure 40, the interface between the quantum well structure 40 and the blocking layer 50, and the interface between the blocking layer 50 and the contact layer 60 are preferably $1 \times 10^{17}$ cm$^{-3}$ or less. In this case, the sensitivity can be further improved.

Preferably, in the semiconductor laminate 10, the buffer layer 30, the quantum well structure 40, the blocking layer 50, and the contact layer 60 are formed by a metal organic chemical vapor deposition method.

In this case, a semiconductor laminate 10 formed of high-quality crystals can be easily obtained.

Figure 2:
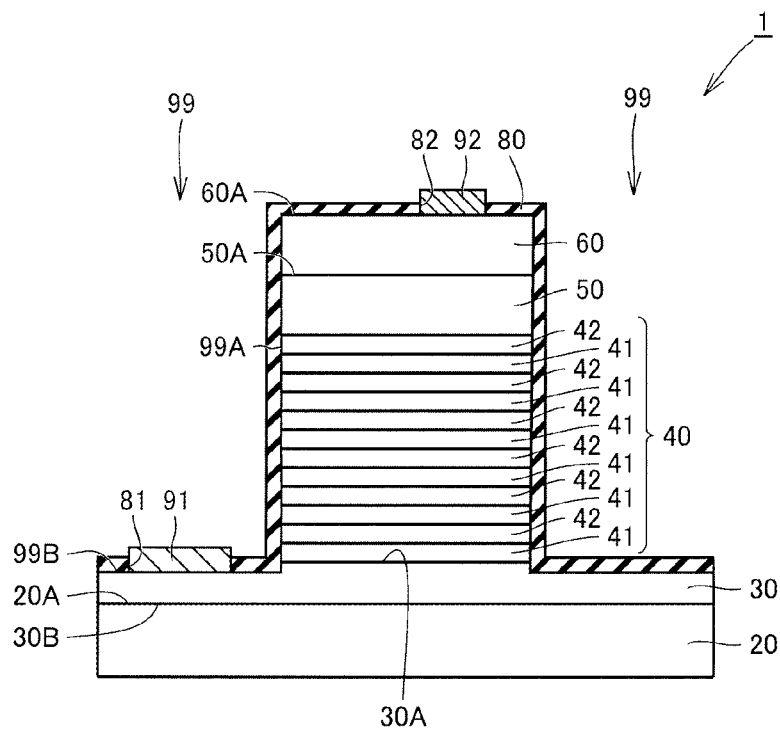
FIG. 2 is a schematic cross-sectional view showing the structure of a light-receiving device in embodiment 1.

Next, a description will be given of an infrared light-receiving device (photodiode), which is an example of the light-receiving device manufactured using the semiconductor laminate 10. Referring to FIG. 2, the infrared light-receiving device 1 in the present embodiment is manufactured using the semiconductor laminate 10 in the present embodiment and includes the substrate 20, the buffer layer 30, the quantum well structure 40, the blocking layer 50, and the contact layer 60 that are laminated in the same manner as in the semiconductor laminate 10. Trenches 99 that pass through the contact layer 60, the blocking layer 50, and the quantum well structure 40 and reach the buffer layer 30 are formed in the infrared light-receiving device 1. Specifically, the contact layer 60, the blocking layer 50, and the quantum well structure 40 are exposed at side walls 99A of the trenches 99. Bottom walls 99B of the trenches 99 are located in the buffer layer 30. Specifically, the buffer layer 30 is exposed at the bottom walls 99B of the trenches 99.

The infrared light-receiving device 1 further includes a passivation film 80, an n-side electrode 91, and a p-side electrode 92. The passivation film 80 is disposed so as to cover the bottom walls 99B of the trenches 99, the side walls 99A of the trenches 99, and a principal surface 60A of the contact layer 60 that is opposite to its surface facing the blocking layer 50. The passivation film 80 is formed of an insulator such as silicon nitride or silicon oxide.

An opening 81 is formed in a portion of the passivation film 80 that covers the bottom wall 99B of one of the trenches 99 so as to pass through the passivation film 80 in its thickness direction. The n-side electrode 91 is disposed so as to fill the opening 81. The n-side electrode 91 is disposed in contact with a portion of the buffer layer 30 that is exposed from the opening 81. The n-side electrode 91 is formed of a conductor such as a metal. More specifically, the n-side electrode 91 may be formed, for example, of Ti (titanium)/Pt (platinum)/Au (gold). The n-side electrode 91 is in ohmic contact with the buffer layer 30.

An opening 82 is formed in a portion of the passivation film 80 that covers the principal surface 60A of the contact layer 60 so as to pass through the passivation film 80 in its thickness direction. The p-side electrode 92 is disposed so as to fill the opening 82. The p-side electrode 92 is disposed in contact with a portion of the contact layer 60 that is exposed from the opening 82. The p-side electrode 92 is formed of a conductor such as a metal. More specifically, the p-side electrode 92 may be formed, for example, of Ti/Pt/Au. The p-side electrode 92 is in ohmic contact with the contact layer 60.

When infrared light enters the infrared light-receiving device 1, the infrared light is absorbed between quantum levels in the quantum well layer 40, and electron-hole pairs are thereby generated. The generated electrons and holes are outputted as a photocurrent signal from the infrared light-receiving device 1, and the infrared light is thereby detected.

The p-side electrode 92 is a pixel electrode. The infrared light-receiving device 1 may include only one p-side electrode 92 serving as a pixel electrode as shown in FIG. 2 or may include a plurality of pixel electrodes (p-side electrodes 92). Specifically, the infrared light-receiving device 1 may have a structure in which the structure shown in FIG. 2 is used as a unit structure and in which a plurality of the unit structures are repeated in the extending direction of the first principal surface 20A of the substrate 20 in FIG. 2. In this case, the infrared light-receiving device 1 includes the plurality of p-side electrodes 92 corresponding to pixels but includes only one n-side electrode 91. This structure will be described in embodiment 2 later.

The infrared light-receiving device 1 in the present embodiment includes the semiconductor laminate 10 in the present embodiment. Therefore, the infrared light-receiving device 1 is a light-receiving device in which the carrier concentration in the quantum well structure 40 functioning as a light-receiving layer is reduced to increase the sensitivity.

Referring next to FIGS. 3 to 8, the outline of a method for manufacturing the semiconductor laminate 10 and the infrared light-receiving device 1 in the present embodiment will be described.

Figure 3:
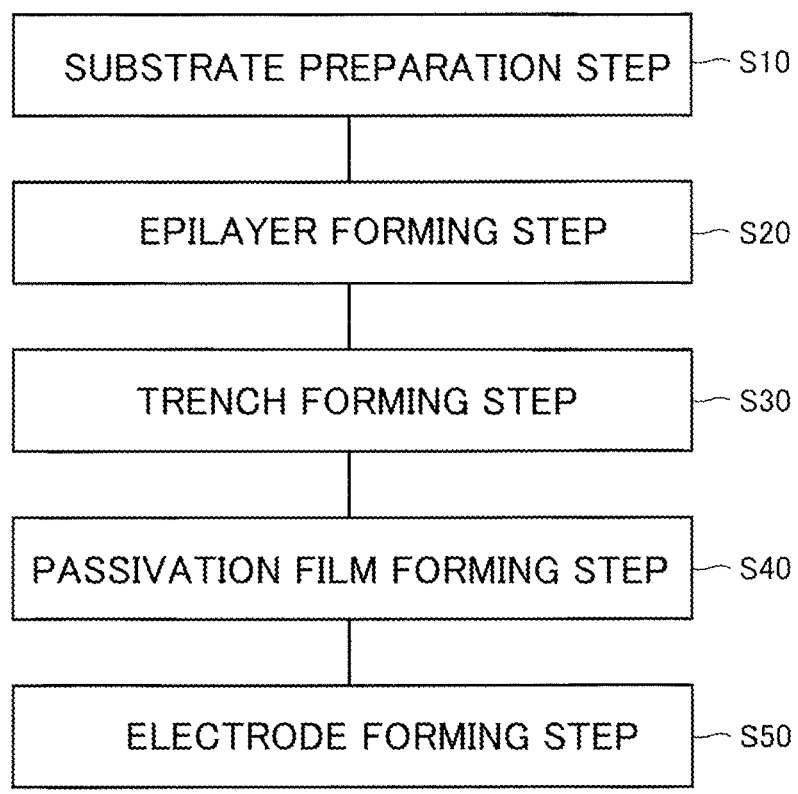
FIG. 3 is a flowchart showing the outline of a method for manufacturing the semiconductor laminate and the light-receiving device in embodiment 1.
Figure 5:
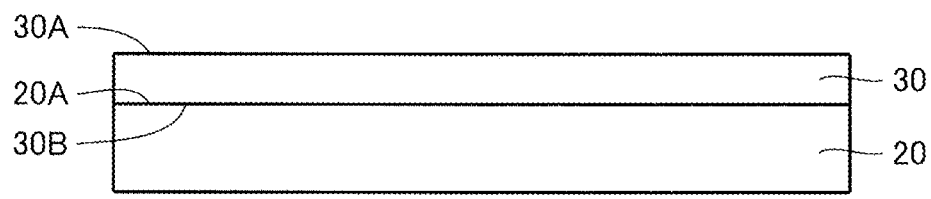
FIG. 5 is a schematic cross-sectional view for illustrating the method for manufacturing the semiconductor laminate and the light-receiving device in embodiment 1.
Figure 6:
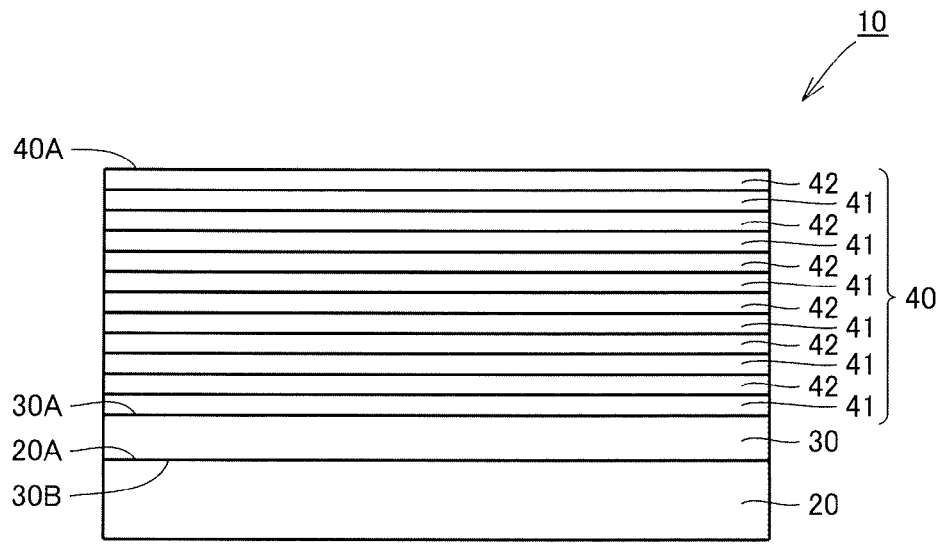
FIG. 6 is a schematic cross-sectional view for illustrating the method for manufacturing the semiconductor laminate and the light-receiving device in embodiment 1.

Referring to FIG. 3, in the method for manufacturing the semiconductor laminate 10 and the infrared light-receiving device 1 in the present embodiment, a substrate preparation step is first performed as step (S10). Referring to FIG. 5, in step (S10), an InP substrate 20 having a diameter of, for example, 2 inches (50.8 mm) is prepared. More specifically, an InP ingot is sliced to obtain the InP substrate 20. The substrate 20 is subjected to surface polishing and then to a process such as cleaning. The substrate 20 prepared has a principal surface 20A with high flatness and cleanliness.

Figure 4:
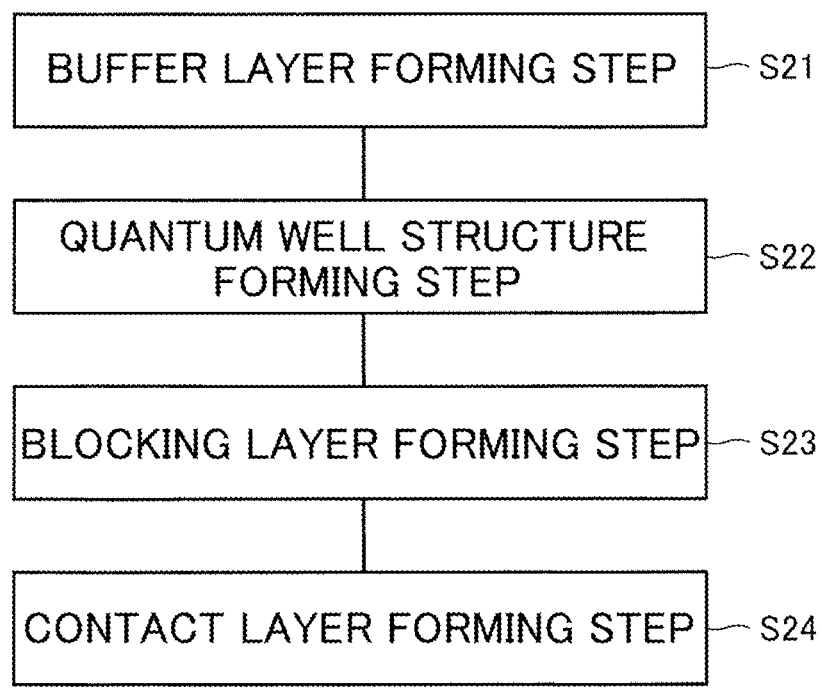
FIG. 4 is a flowchart showing the outline of the procedure of an epilayer forming step in embodiment 1.

Next, an epilayer forming step is performed as step (S20). In step (S20), the buffer layer 30, the quantum well structure 40, the blocking layer 50, and the contact layer 60 are formed as epilayers on the principal surface 20A of the substrate 20 prepared in step (S10). The epilayers may be formed, for example, by metal-organic chemical vapor deposition. The formation of the epilayers by the metal-organic chemical vapor deposition can be performed, for example, by placing the substrate 20 on a rotary table equipped with a heater for heating the substrate and supplying source gases onto the substrate while the substrate 20 is heated by the heater. Referring to FIG. 4, step (S20) includes a buffer layer forming step (S21), a quantum well structure forming step (S22), a blocking layer forming step (S23), and a contact layer forming step (S24).

In step (S20), step (S21) is first performed. Specifically, referring to FIG. 5, the buffer layer 30 formed of, for example, n-InGaAs, which is a group III-V compound semiconductor, is first formed in contact with the principal surface 20A of the substrate 20 by metal-organic chemical vapor deposition. To form the buffer layer 30 formed of n-InGaAs, TMIn (trimethylindium) or TEIn (triethylindium), for example, may be used as the source gas for In; TEGa (triethylgallium) or TMGa (trimethylgallium), for example, may be used as the source gas for Ga; and $AsH_3$ (arsine), TBAs (tertiary butyl arsine), or TMAs (trimethylarsine), for example, may be used as the source gas for As. When Si is added as n-type impurities, $SiH_4$ (silane), $SiH_3(CH_3)$ (monomethylsilane), or TeESi (tetraethylsilane), for example, may be added to the source gases.

Next, step (S22) is performed. Specifically, referring to FIGS. 5 and 6, the first element layers 41 formed of, for example, $In_xGa_{1-x}As$ (x is from 0.38 to 1 inclusive), which is a group III-V compound semiconductor, and the second element layers 42 formed of, for example, $GaAs_{1-y}Sb_y$ (y is from 0.36 to 1 inclusive), which is a group III-V compound semiconductor, are laminated alternately so as to be in contact with the first principal surface 30A of the buffer layer 30 that is opposite to its surface facing the substrate 20 to thereby form the quantum well structure 40. The quantum well structure 40 may be formed by metal-organic chemical vapor deposition right after the formation of the buffer layer 30. Specifically, the quantum well structure 40 may be formed by changing the source gases used to form the buffer layer 30 to different source gases with the substrate 20 placed in a device used to form the buffer layer 30.

To form the first element layers 41 formed of $In_xGa_{1-x}As$ (x is from 0.38 to 1 inclusive), TMIn or TEIn, for example, may be used as the raw material of In; TEGa or TMGa, for example, may be used as the raw material of Ga; and TMSb, TESb, TIPSb, TDMASb, or TTBSb, for example, may be used as the raw material of Sb.

To form the second element layers 42 formed of GaAs$_{1-y}$Sb$_y$, (y is from 0.36 to 1 inclusive), TEGa or TMGa, for example, may be used as the raw material of Ga; TBAs (tertiary butyl arsine) or TMAs (trimethylarsine), for example, may be used as the raw material of As; and TMSb, TESb, TIPSb, TDMASb, or TTBSb, for example, may be used as the raw material of Sb. The first element layers 41 and the second element layers 42 formed may each have a thickness of, for example, 5 nm, and 250 unit structures each consisting of a first element layer 41 and a second element layer 42 may be laminated. In this manner, the quantum well structure 40, which is a type-II quantum well, can be formed. The Sb steepness in the first element layers 41 is adjusted to an appropriate value, i.e., from 0.5 nm to 3.0 nm inclusive.

The growth temperature in step (S22) is preferably from 510° C. to 570° C. inclusive and more preferably from 520° C. to 540° C. inclusive. By using a temperature range higher than a general growth temperature of the quantum well structure (about 500° C.) as described above, the Sb steepness can be easily adjusted to an appropriate value.

The growth rate in step (S22) may be 0.1 μm/h or less. By using the growth rate lower than a general growth rate of the quantum well structure (about 1 μm/h) as described above, the Sb steepness can be easily adjusted to an appropriate value.

In step (S22), the ratio (V/III ratio) of the supply amount of a raw material of a group V element to the supply amount of a raw material of a group III element may be 3 or less. By using the V/III ratio less than a general V/III ratio (10 to several tens) as described above, the Sb steepness can be easily adjusted to an appropriate value.

Next, step (S23) is performed. Specifically, referring to FIGS. 6 and 1, the blocking layer 50 formed of, for example, ud-InGaAs, which is a group III-V compound semiconductor, is formed in contact with the principal surface 40A of the quantum well structure 40 that is opposite to its surface facing the buffer layer 30. The blocking layer 50 may be formed by metal-organic chemical vapor deposition right after the formation of the quantum well structure 40. Specifically, the blocking layer 50 may be formed by changing the source gases used to form the quantum well structure 40 to different source gases with the substrate 20 placed in the device used to form the quantum well structure 40.

Next, step (S24) is performed. Specifically, referring to FIG. 1, the contact layer 60 formed of, for example, p-InP, which is a group III-V compound semiconductor, is formed in contact with the principal surface 50A of the blocking layer 50 that is opposite to its surface facing the quantum well structure 40. The contact layer 60 may be formed by metal-organic chemical vapor deposition right after the formation of the blocking layer 50. Specifically, the contact layer 60 may be formed by changing the source gases used to form the blocking layer 50 to different source gases with the substrate 20 placed in the device used to form the blocking layer 50. When Zn is added as p-type impurities, DMZn (dimethylzinc) or DEZn (diethylzinc), for example, may be added to the source gases.

Through the above procedure, the semiconductor laminate 10 in the present embodiment is completed. By performing step (S20) by metal-organic chemical vapor deposition as described above, the efficiency of production of the semiconductor laminate 10 can be improved. In Step (S20), the metal-organic chemical vapor deposition method using only organic-metal raw materials (all metal-organic chemical vapor deposition method) is used, but this not a limitation. For example, a metal-organic chemical vapor deposition method that uses AsH$_3$ (arsine) as the raw material of As and a hydride such as SiH$_4$ (silane) as the raw material of Si may be performed. However, the use of the all metal-organic chemical vapor deposition method allows a semiconductor laminate 10 composed of high-quality crystals to be obtained. A method other than the metal-organic chemical vapor deposition may be performed, and an MBE (Molecular Beam Epitaxy) method, for example, may be used.

Preferably, steps (S21) to (S24) are performed continuously by changing the source gases with the substrate 20 placed in the device as described above. Specifically, it is preferable that steps (S21) to (S24) are performed such that the buffer layer 30, the quantum well structure 40, the blocking layer 50, and the contact layer 60 are laminated without formation of a regrown interface. In this manner, a semiconductor laminate 10 that contributes to improvement in sensitivity can be obtained.

Figure 7:
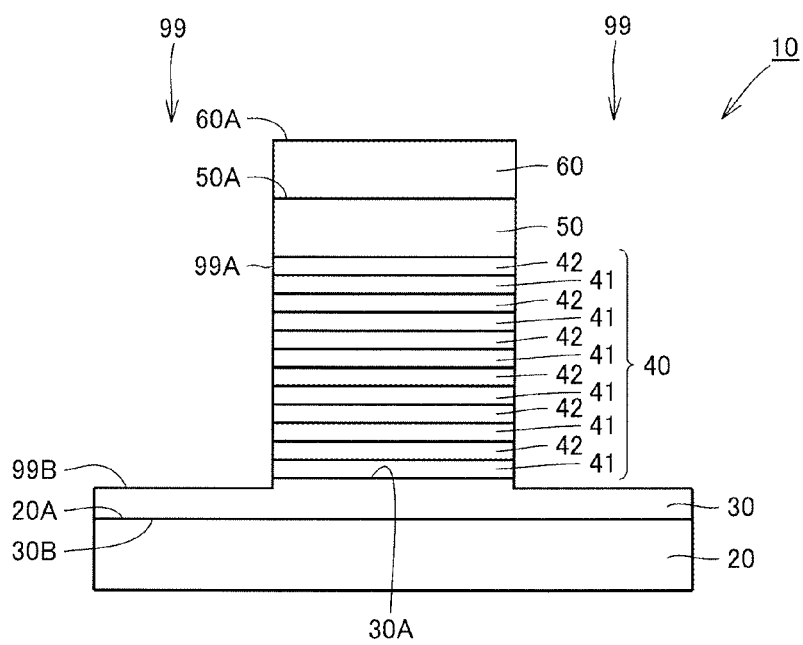
FIG. 7 is a schematic cross-sectional view for illustrating the method for manufacturing the semiconductor laminate and the light-receiving device in embodiment 1.

Referring next to FIG. 3, a trench forming step is performed as step (S30). Referring to FIGS. 1 and 7, in step (S30), the trenches 99 that pass through the contact layer 60, the blocking layer 50, and the quantum well structure 40 and reach the buffer layer 30 are formed on the semiconductor laminate 10 produced through steps (S10) to (S20). For example, the trenches 99 may be formed by forming a mask layer having openings corresponding to the shape of the trenches 99 on the principal surface 60A of the contact layer 60 and then performing etching.

Figure 8:
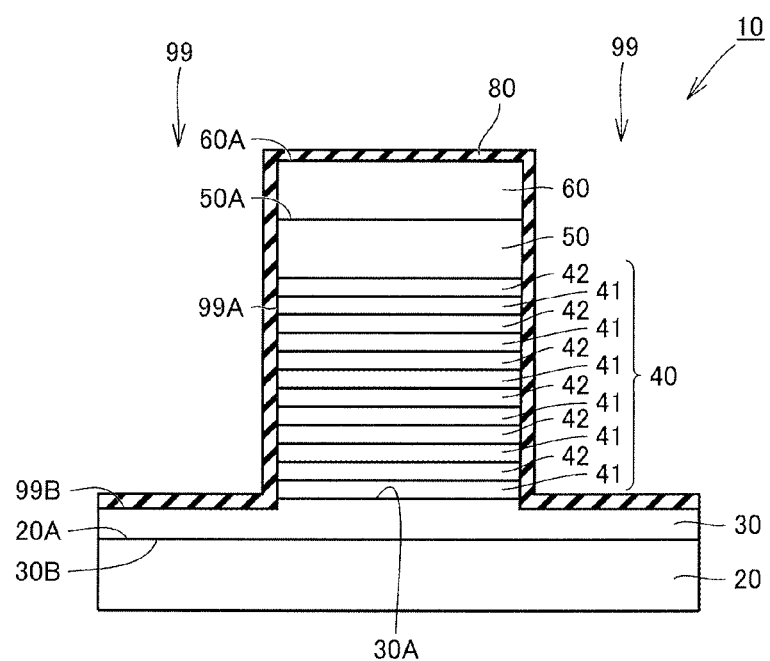
FIG. 8 is a schematic cross-sectional view for illustrating the method for manufacturing the semiconductor laminate and the light-receiving device in embodiment 1.

Next, a passivation film forming step is performed as step (S40). Referring to FIGS. 7 and 8, in step (S40), the passivation film 80 is formed on the semiconductor laminate 10 with the trenches 99 formed in step (S30). Specifically, for example, the passivation film 80 formed of an insulator such as silicon oxide or silicon nitride is formed by CVD (Chemical Vapor Deposition). The passivation film 80 is formed so as to cover the bottom walls 99B of the trenches 99, the side walls 99A of the trenches 99, and the principal surface 60A of the contact layer 60 that is opposite to its surface facing the blocking layer 50.

Next, an electrode forming step is performed as step (S50). Referring to FIGS. 8 and 2, in step (S50), the n-side electrode 91 and the p-side electrode 92 are formed in the semiconductor laminate 10 with the passivation film 80 formed in step (S40). Specifically, for example, a mask having openings at positions corresponding to regions in which the n-side electrode 91 and the p-side electrode 92 are to be formed is formed on the passivation film 80, and the openings 81 and 82 are formed in the passivation film 80 using the mask. Then the n-side electrode 91 and the p-side electrode 92 formed of an appropriate conductor are formed by, for example, an evaporation method. The infrared light-receiving devices 1 in the present embodiment are completed through these steps. Then the devices are separated by dicing.

Embodiment 2

Figure 9:
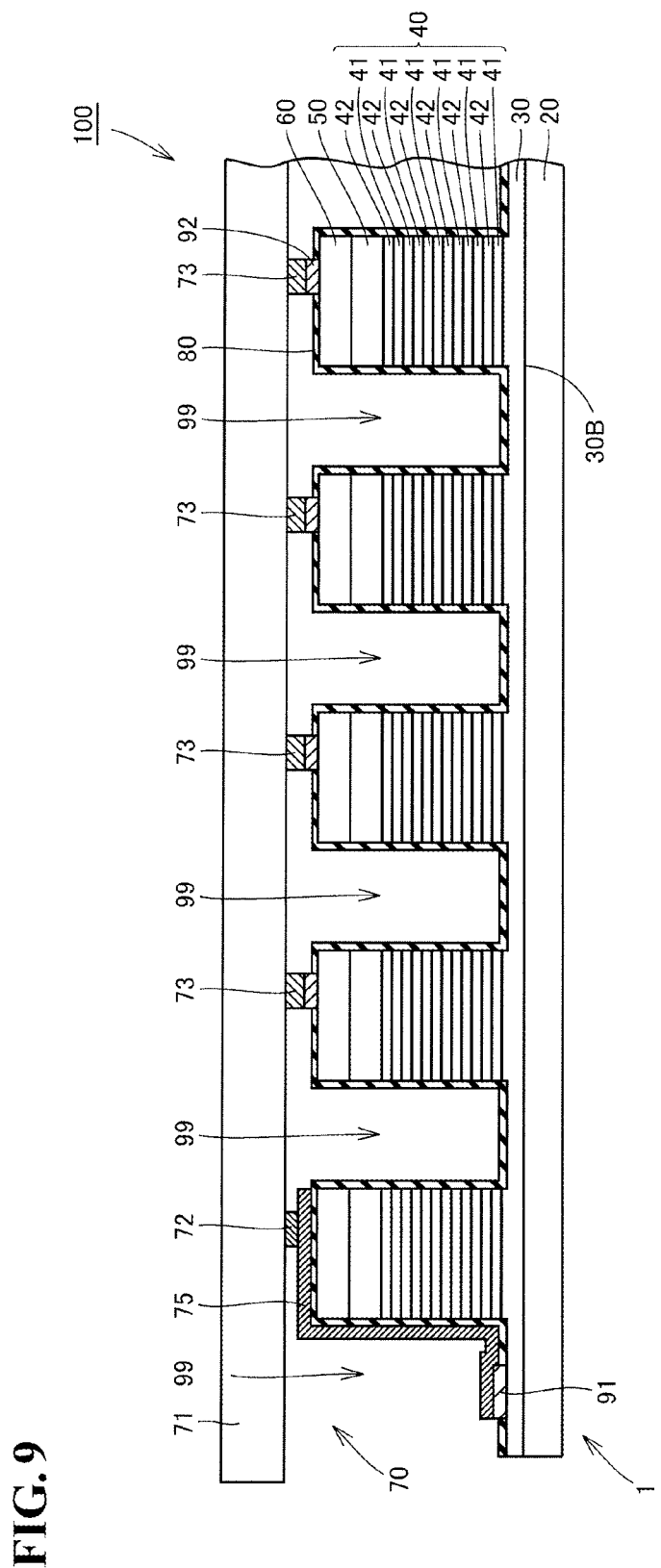
FIG. 9 is a schematic cross-sectional view showing the structure of a light-receiving device and a sensor in embodiment 2.

A light-receiving device in embodiment 2 will be described. Referring to FIGS. 9 and 2, the infrared light-receiving device 1 in embodiment 2 has a structure in which the structure shown in FIG. 2 is used as a unit structure and in which a plurality of the unit structures are repeated in the extending direction of the first principal surface 20A of the substrate 20. The infrared light-receiving device 1 has a plurality of p-side electrodes 92 corresponding to pixels. However, only one n-side electrode 91 is disposed.

More specifically, referring to FIG. 9, the n-side electrode 91 of the infrared light-receiving device 1 in embodiment 2 is formed on the bottom wall of a trench 99 located at an end in the extending direction of the substrate 20. A p-side electrode 92 on a portion of the contact layer 60 that is adjacent to the trench 99 located at the end is omitted. An infrared light sensor 100 in the present embodiment includes the infrared light-receiving device 1 having the structure described above and a read-out integrated circuit (ROTC) 70 electrically connected to the infrared light-receiving device 1. The read-out integrated circuit 70 is, for example, a CMOS (Complementary Metal Oxide Semiconductor) circuit.

A plurality of read-out electrodes (not shown) provided in a main body 71 of the read-out integrated circuit 70 are electrically connected through bumps 73 in a one-to-one relationship to the plurality of p-side electrodes 92 functioning as pixel electrodes in the infrared light-receiving device 1. The infrared light-receiving device 1 further includes a wiring line 75. The wiring line 75 is formed in contact with the n-side electrode 91, extends along the bottom and side walls of the trench 99 in which the n-side electrode 91 is located, and reaches the contact layer 60. The wiring line 75 is electrically connected through a bump 72 to a ground electrode (not shown) provided in the main body 71 of the read-out integrated circuit 70. With the above structure, a light reception information signal for each pixel in the infrared light-receiving device 1 is outputted from each p-side electrode 92 (pixel electrode) to the corresponding read-out electrode of the read-out integrated circuit 70. The light reception information signals are collected by the read-out integrated circuit 70, and a two-dimensional image can thereby be obtained.

EXAMPLES

An experiment for examining the relation between the Sb steepness and the carrier concentration in the first element layers of the quantum well structure was performed. The experimental procedure is as follows.

First, a semiconductor laminate 10 was produced in the same procedure as in embodiment 1. The substrate 20 used was InP containing S as impurities. The buffer layer 30 used was an InGaAs layer containing Si as impurities and having a thickness of 0.15 μm. The quantum well structure 40 used had 250 pairs of a first element layer 41 having a thickness of 5 nm and formed of InGaAs and a second element layer 42 having a thickness of 5 nm and formed of GaAsSb, the first element layers 41 and the second element layers 42 being laminated alternately. The blocking layer 50 used was an ud-InGaAs layer having a thickness of 0.9 μm. The contact layer 60 used was an InP layer containing Zn as impurities and having a thickness of 0.8 μm. In this case, by changing the growth temperature in step (S22) (the growth temperature of the quantum well structure 40), the Sb steepness in the first element layers 41 was changed. The Sb steepness and the carrier concentration in each of the semiconductor laminates 10 obtained were measured, and their relation was examined.

Figure 10A:
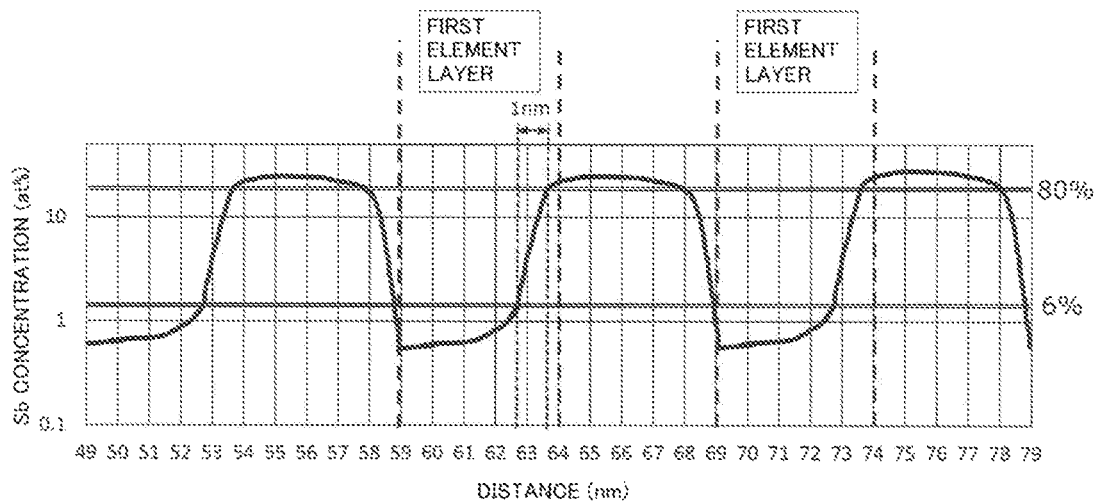
FIG. 10A is a graph showing an example of the concentration profile of Sb in a quantum well structure grown at a temperature of 510° C. in its thickness direction toward the substrate.
Figure 10B:
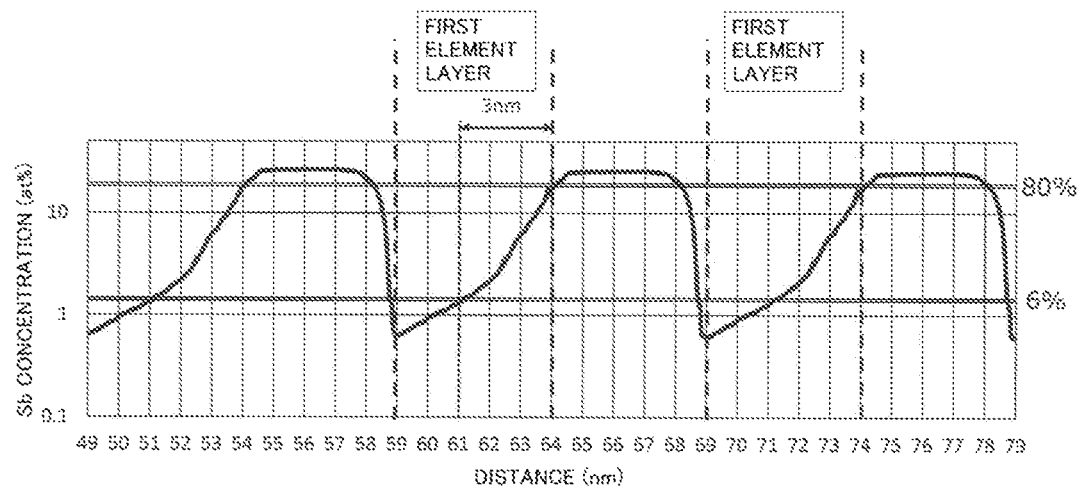
FIG. 10B is a graph showing an example of the concentration profile of Sb in a quantum well structure grown at a temperature of 570° C. in its thickness direction toward the substrate.

The Sb steepness can be measured using, for example, a three-dimensional atom probe. The three-dimensional atom probe is an element concentration distribution measurement device having a resolution on the order of sub-nanometers. More specifically, the three-dimensional atom probe used is LEAP 4000XSi manufactured by AMETEK. The measurement conditions are a leaser wavelength of 355 nm, a laser power of 0.1 pJ, a sample temperature of 30K, a detection rate of 0.003 ions/pulse, and a pulse Rate of 500 kHz. The sample is processed into a needle shape having a tip diameter of about 50 nm to about 100 nm. To process the sample, an FIB (Focused Ion Beam) was used. FIGS. 10A and 10B show examples of the concentration profile of Sb measured using the three-dimensional atom probe. In FIGS. 10A and 10B, the horizontal axis represents the distance from the surface of the quantum well structure in a thickness direction toward the substrate, and the vertical axis represents the concentration of Sb. Specifically, in FIGS. 10A and 10B, a direction in which the distance decreases is a direction away from the substrate. FIG. 10A shows the results of measurement when the growth temperature of the quantum well structure 40 was 510° C. FIG. 10B shows the results of measurement when the growth temperature of the quantum well structure 40 was 570° C. These measurement results were used to evaluate the Sb steepness. The Sb steepness when the growth temperature was 510° C. was 1.0 nm, and the Sb steepness when the growth temperature was 570° C. was 3.0 nm.

Figure 11:
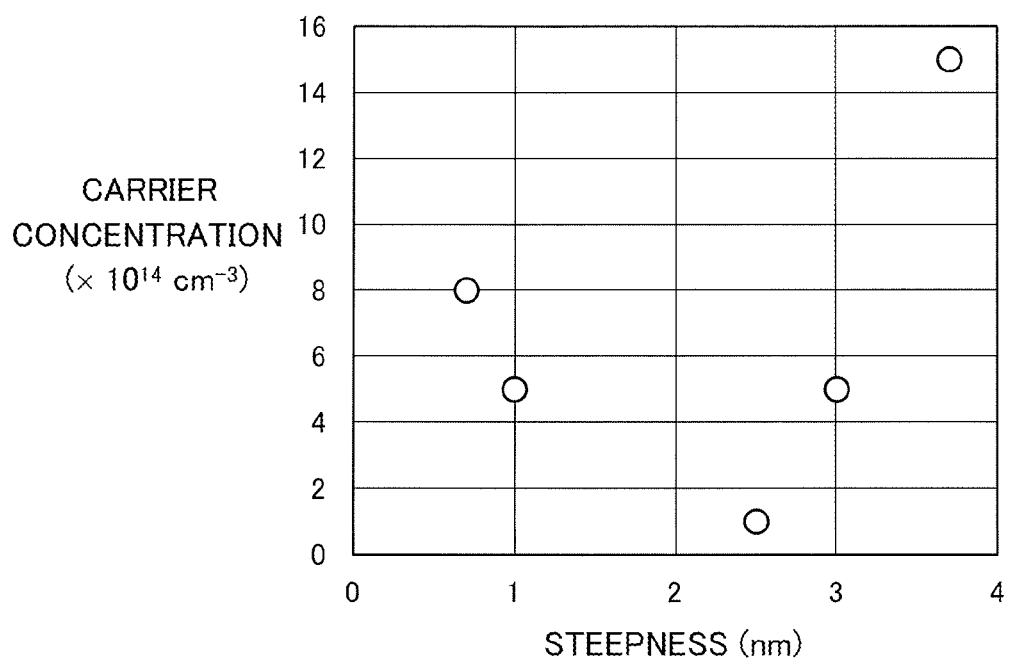
FIG. 11 is a graph showing the relation between Sb steepness and the concentration of carriers.

FIG. 11 shows the relation between the Sb steepness evaluated as described above and the carrier concentration measured separately. In FIG. 11, the horizontal axis corresponds to the Sb steepness in the first element layers 41, and the vertical axis corresponds to the carrier concentration. As can be seen from FIG. 11, as the Sb steepness increases, the carrier concentration decreases and then steeply increases. When the Sb steepness is from 0.5 nm to 3.0 nm inclusive, the carrier concentration is $10 \times 10^{14}$ $cm^{-3}$ or less. As can be seen, in the semiconductor laminate and the light-receiving device in the present application, the sensitivity can be increased by reducing the carrier concentration in the quantum well structure. When the Sb steepness is 1 nm or more, the carrier concentration can be $5 \times 10^{14}$ $cm^{-3}$ or less. Therefore, the Sb steepness in the first element layers 41 is more preferably 1.0 nm or more.

It should be understood that the embodiments and Examples disclosed herein are illustrative in all aspects and non-restrictive in every respect. The scope of the present invention is defined not by the above description but by the claims. It is intended that the present invention includes all modifications which fall within the scope of the claims and meaning equivalent to the scope of the claims.

REFERENCE SIGNS LIST 1 infrared light-receiving device
10 semiconductor laminate
20 substrate
20A principal surface
30 buffer layer
30A principal surface
40 quantum well structure
40A principal surface
41 first element layer
42 second element layer
50 blocking layer
50A principal surface
60 contact layer
60A principal surface
70 read-out integrated circuit
71 main body
72, 73 bump
75 wiring line
80 passivation film
81 opening
82 opening
91 n-side electrode
92 p-side electrode
99 trench 99A side wall
99B bottom wall
100 infrared light sensor

The invention claimed is:

1. A semiconductor laminate comprising:
a substrate formed of a group III-V compound semiconductor; and
a quantum well structure disposed on the substrate,
wherein the quantum well structure includes
a second element layer formed of a group III-V compound semiconductor and containing Sb and
a first element layer formed of a group III-V compound semiconductor and disposed in contact with the second element layer,
wherein, in the first element layer, a thickness of a region in which a content of Sb decreases in a direction away from the substrate from 80% of a maximum content of Sb in the second element layer to 6% of the maximum content is from 0.5 nm to 3.0 nm inclusive.

2. The semiconductor laminate according to claim 1, wherein the quantum well structure is a type-II quantum well structure.

3. The semiconductor laminate according to claim 1, wherein the first element layer is an $In_xGa_{1-x}As$ (x is from 0.38 to 1 inclusive) layer or a $Ga_{1-u}In_uN_vAs_{1-v}$ (u is from 0.4 to 0.8 inclusive, and v is more than 0 and 0.2 or less) layer, and
wherein the second element layer is a $GaAs_{1-y}Sb_y$ (y is from 0.36 to 1 inclusive) layer.

4. The semiconductor laminate according to claim 1, wherein, in the first element layer, the thickness of the region in which the content of Sb decreases in the direction away from the substrate from 80% of the maximum content of Sb in the second element layer to 6% of the maximum content is from 1.0 nm to 3.0 nm inclusive.

5. A semiconductor laminate comprising:
a substrate formed of a group III-V compound semiconductor; and
a quantum well structure disposed on the substrate,
wherein the quantum well structure includes
a second element layer formed of a group III-V compound semiconductor and containing Sb and
a first element layer formed of a group III-V compound semiconductor and disposed in contact with the second element layer,
wherein, in the first element layer, a thickness of a region in which a content of Sb decreases in a direction away from the substrate from 80% of a maximum content of Sb in the second element layer to 6% of the maximum content is from 1.0 nm to 3.0 nm inclusive,
wherein the quantum well structure is a type-II quantum well structure,
wherein the first element layer is an $In_xGa_{1-x}As$ (x is from 0.38 to 1 inclusive) layer or a $Ga_{1-u}In_uN_vAs_{1-v}$ (u is from 0.4 to 0.8 inclusive, and v is more than 0 and 0.2 or less) layer, and
wherein the second element layer is a $GaAs_{1-y}Sb_y$ (y is from 0.36 to 1 inclusive) layer.

6. The semiconductor laminate according to claim 1, wherein the substrate is formed of GaAs, GaP, GaSb, InP, InAs, InSb, AlSb, or AlAs.

7. A light-receiving device comprising:
the semiconductor laminate according to claim 1; and
electrodes formed on the semiconductor laminate.

8. A method for manufacturing a semiconductor laminate, the method comprising the steps of:
preparing a substrate formed of a group III-V compound semiconductor; and
forming epilayers formed of respective group III-V compound semiconductors on the substrate,
wherein the step of forming the epilayers includes the step of forming a quantum well structure,
wherein, in the step of forming the quantum well structure, a second element layer formed of a group III-V compound semiconductor and containing Sb and a first element layer formed of a group III-V compound semiconductor and disposed in contact with the second element layer are formed, and
wherein, in the step of forming the quantum well structure, the first element layer and the second element layer are formed such that, in the first element layer, a thickness of a region in which a content of Sb decreases in a direction away from the substrate from 80% of a maximum content of Sb in the second element layer to 6% of the maximum content is from 0.5 nm to 3.0 nm inclusive.

9. The method for manufacturing a semiconductor laminate according to claim 8,
wherein, in the step of forming the quantum well structure, the first element layer and the second element layer are formed such that, in the first element layer, the thickness of the region in which the content of Sb decreases in the direction away from the substrate from 80% of the maximum content of Sb in the second element layer to 6% of the maximum content is from 1.0 nm to 3.0 nm inclusive.

10. The method for manufacturing a semiconductor laminate according to claim 8,
wherein, in the step of forming the quantum well structure, the first element layer and the second element layer are formed in the temperature range of from 510° C. to 570° C. inclusive.

11. The method for manufacturing a semiconductor laminate according to claim 8,
wherein, in the step of forming the quantum well structure, the first element layer and the second element layer are formed under the condition that the ratio of the supply amount of a raw material of a group V element to the supply amount of a raw material of a group III element is 3 or less.

12. The method for manufacturing a semiconductor laminate according to claim 8,
wherein, in the step of forming the quantum well structure, the first element layer and the second element layer are formed at a growth rate of 0.1 μm/h or less.

* * * * *